United States Patent
Margavio et al.

(10) Patent No.: US 12,046,502 B2
(45) Date of Patent: Jul. 23, 2024

(54) ELECTROSTATIC PUCK AND METHOD OF MANUFACTURE

(71) Applicant: Watlow Electric Manufacturing Company, St. Louis, MO (US)

(72) Inventors: Patrick Margavio, Columbia, MO (US); Kurt English, Columbia, MO (US); Kevin Ptasienski, O'Fallon, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 756 days.

(21) Appl. No.: 16/565,054

(22) Filed: Sep. 9, 2019

(65) Prior Publication Data

US 2021/0074569 A1   Mar. 11, 2021

(51) Int. Cl.
*H01L 21/683* (2006.01)

(52) U.S. Cl.
CPC .............................. *H01L 21/6833* (2013.01)

(58) Field of Classification Search
CPC ............... H01L 21/683; H01L 21/6831; H01L 21/6833; H05B 3/18; H05B 3/20; H05B 3/22; H05B 3/28; H05B 3/283; H02N 13/00
USPC ........... 361/233, 234; 29/885; 264/614, 618, 264/619
See application file for complete search history.

(56) References Cited

U.S. PATENT DOCUMENTS

| | | | |
|---|---|---|---|
| 4,480,284 A | 10/1984 | Tojo et al. | |
| 5,777,838 A * | 7/1998 | Tamagawa | H01L 21/6875 279/128 |
| 6,821,899 B2 | 11/2004 | Lohokare et al. | |
| 7,132,369 B2 | 11/2006 | Delgadino et al. | |
| 8,476,167 B2 * | 7/2013 | Van Mierlo | G03F 7/70708 438/700 |
| 9,299,577 B2 | 3/2016 | Ren et al. | |
| 10,276,504 B2 | 4/2019 | Luu et al. | |
| 2006/0096946 A1 * | 5/2006 | Schaepkens | H01L 21/6833 118/724 |

(Continued)

FOREIGN PATENT DOCUMENTS

KR   20100128229 A  * 12/2010
TW      200915473       4/2009

OTHER PUBLICATIONS

English translation of KR20100128229A (Year: 2010).*

(Continued)

*Primary Examiner* — Thienvu V Tran
*Assistant Examiner* — Carlos O Rivera-Perez
(74) *Attorney, Agent, or Firm* — Burris Law, PLLC

(57) ABSTRACT

A method of constructing an E-puck includes forming at least one trench into a lower substrate, depositing an electrode material onto the lower substrate and into the at least one trench, removing excess electrode material from the lower substrate to leave the electrode material within the at least one trench to form an electrode, and forming a dielectric on the lower substrate and the electrode. The electrode is between the lower substrate and the upper substrate. Forming the at least one trench into the lower substrate forms at least one standoff portion adjacent to the at least one trench and the at least one standoff portion reduces dishing of the electrode material during removal of the excess electrode material from the lower substrate.

20 Claims, 3 Drawing Sheets

(56) References Cited

U.S. PATENT DOCUMENTS

Figure 1:
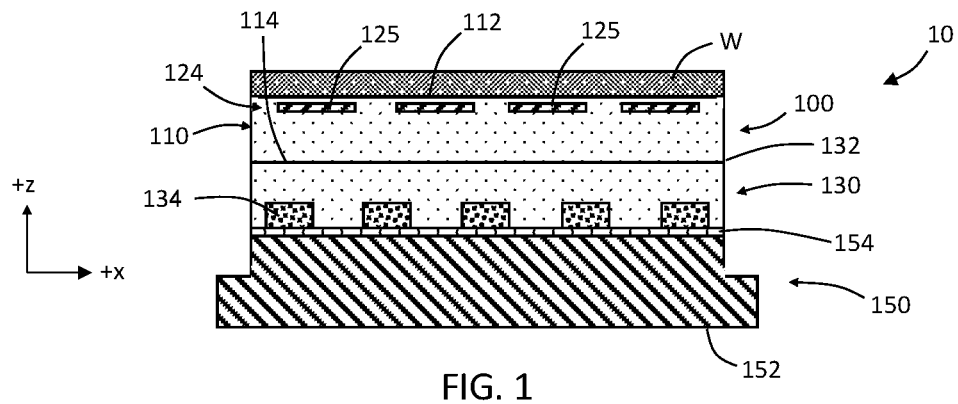

| | | |
|---|---|---|
| 2009/0002913 A1 | 1/2009 | Naim |
| 2012/0154974 A1* | 6/2012 | Bhatnagar ......... H01L 21/67017 |
| | | 361/234 |
| 2013/0288474 A1 | 10/2013 | Mishra et al. |
| 2014/0097539 A1 | 4/2014 | Zhang et al. |
| 2017/0111958 A1* | 4/2017 | Zhang ................. H05B 1/0233 |
| 2018/0047557 A1 | 2/2018 | Odnoblyudov et al. |
| 2018/0130672 A1 | 5/2018 | Kim et al. |
| 2018/0351072 A1 | 12/2018 | Kirby et al. |
| 2019/0159294 A1 | 5/2019 | Ptasienski et al. |

OTHER PUBLICATIONS

International Search Report for International Application PCT/US2020/050009, mailed Dec. 17, 2020.

Office Action issued in Corresponding European Application No. 20780451.9 dated Dec. 14, 2023, 7 pages.

* cited by examiner

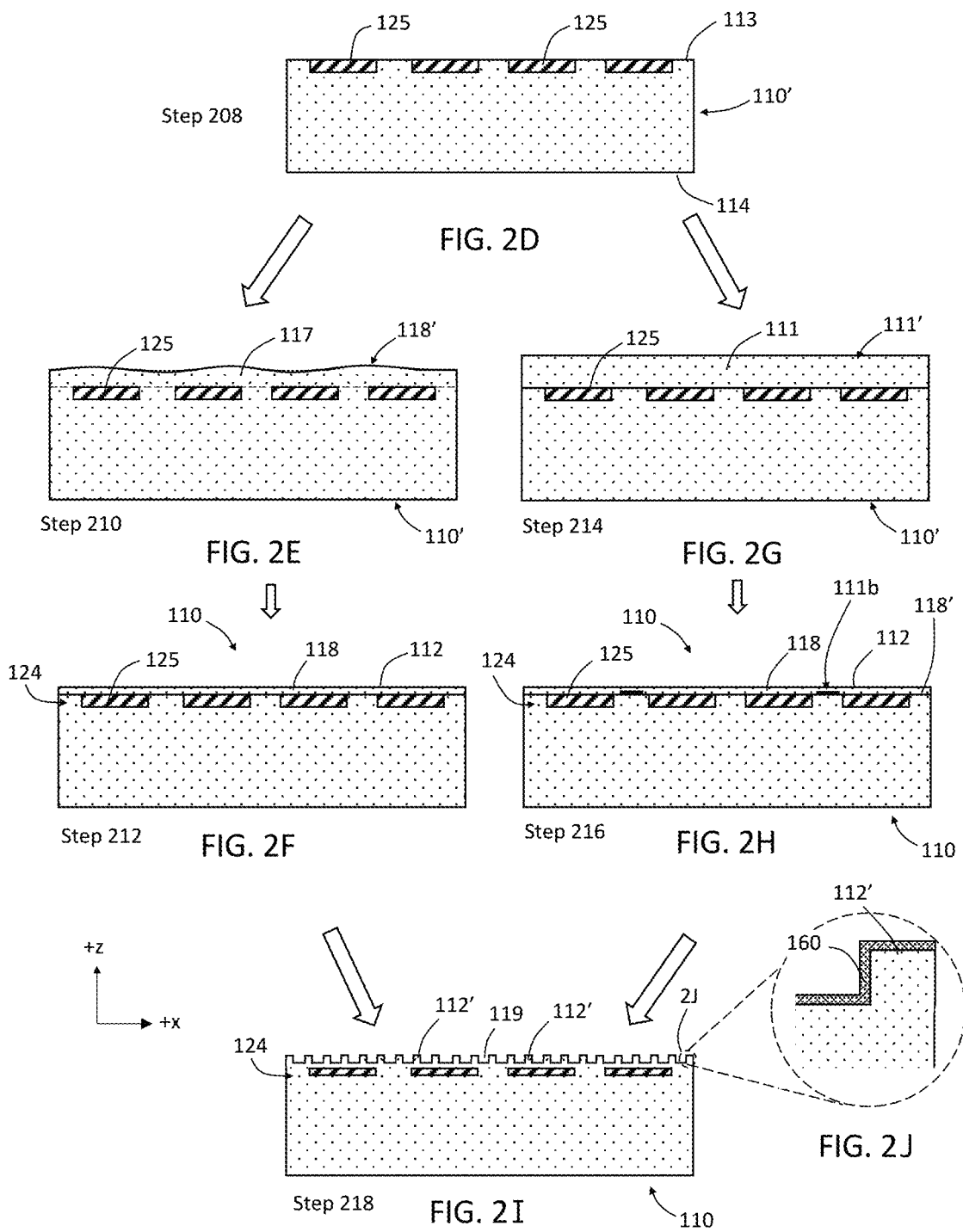

ELECTROSTATIC PUCK AND METHOD OF MANUFACTURE

FIELD

The present disclosure relates to electrostatic pucks for use in semiconductor processing, and more generally to ceramic pucks with embedded electrodes.

BACKGROUND

The statements in this section merely provide background information related to the present disclosure and may not constitute prior art.

Typically, an electrostatic chuck (also referred to herein as an "E-chuck") is used as a clamping surface for electrostatically securing a semiconductor wafer thereon during a vapor deposition or etching process. The"E-chuck" may include an "electrostatic puck" (also referred to herein as an "E-puck") consisting of a sintered ceramic structure with an electrode embedded between two ceramic plate members, and a conductive path established from the electrode through the ceramic plate member. In operation, an electrical potential, e.g., between 300 to 12,000 volts, is applied to the conductive path through a terminal lead such that the electrode of the E-puck is energized. When energized, an electrostatic force is generated between an external electrode, e.g., the semiconductor wafer, and the electrode embedded inside the E-puck.

One method for manufacturing an E-puck having an embedded electrode includes forming a first layer of a green ceramic material, screen printing a film electrode onto the first layer, depositing a second layer of the green ceramic material over the screen printed electrode and sintering the resulting ceramic structure. However, electrostatic chucks made with this method of manufacture can display fluctuations or non-uniformities in the thickness of the second layer as well as extremely small cracks and pores which can adversely affect the ability of the E-puck to electrostatically secure the substrate to the E-puck surface. Also, non-uniformities in the thickness of the electrode can adversely affect the electrostatic force between the semiconductor wafer and the electrode embedded inside the E-puck. Furthermore, the sintering process can alter the properties of the ceramic materials and impact their power density, or Watts/° K, thus contributing to nonuniformities in the E-puck thermal profile during operation.

These issues with forming an E-puck, among other issues related to forming ceramic parts having embedded electrical components, are addressed by the present disclosure.

SUMMARY

This section provides a general summary of the disclosure and is not a comprehensive disclosure of its full scope or all of its features.

In one form of the present disclosure, a method of constructing an electrostatic puck (E-puck) includes forming at least one trench into an upper surface of a lower substrate, depositing an electrode material onto the upper surface of the lower substrate and into the at least one trench, removing excess electrode material from the lower substrate to thereby leave the electrode material within the at least one trench of the substrate to form an electrode, and securing an upper substrate to the lower substrate without hot pressing. The electrode is flat and co-planar with an outer surface of the upper substrate such that the electrode will be flat and coplanar with a semiconductor wafer electrostatically attached to the E-puck. In one variation of the present disclosure, the excess electrode material is removed by a process such as chemical-mechanical planarization/polishing (CMP), etching, and polishing, among others. In at least one variation, the at least one trench includes at least one standoff portion therewithin.

In at least one form, securing the upper substrate to the lower substrate includes bonding the upper substrate to the lower substrate such that a bond area is formed by the bonding and the bond area is recessed from the lower surface of the upper substrate. In at least one variation the bonding includes a layered process selected from at least one of thick film, thin film, thermal spray, and sol-gel, among others. In one variation, the layered process is thermal spraying.

In at least one form, the method includes forming mesas on an outer surface of the upper substrate. In at least one variation, the method includes depositing an yttria layer onto the outer surface of the upper substrate layer.

In at least one form, the at least one trench is formed by a process such as a laser removal process, a bead blasting process, machining, 3D sintering/printing/additive manufacturing, green state, molding, waterjet, hybrid laser/water, and dry plasma etching, among others.

In at least one form, the electrode material is deposited onto the substrate and into the at least one trench by a layered process such as thick film, thin film, thermal spray, and sol-gel, among others. In the alternative, or in addition to, the electrode material is deposited by melting a metal foil into the at least one trench.

In at least one form, the lower substrate is a ceramic such as aluminum nitride, and aluminum oxide, among others, and the resistive material is a material such as titanium, molybdenum, tungsten, nickel, aluminum and alloys thereof, among others.

In another form of the present disclosure, a method of constructing E-puck includes steps of forming a plurality of trenches into a substrate, wherein a plurality of standoff portions are formed within the plurality of trenches, depositing an electrode material onto the substrate and into the plurality of trenches, removing excess electrode material from the substrate to thereby leave the electrode material within the plurality of trenches to form an electrode, and securing an upper substrate to the lower substrate without hot pressing.

In at least one form, the upper substrate is secured to the lower substrate comprises by bonding the upper substrate to the lower substrate such that a bond area is formed by the bonding and the bond area is recessed from the lower surface of the upper substrate. That is, in at least one variation a bond area is formed by bonding the upper substrate to the lower substrate and the bond area is recessed from the lower surface of the upper substrate.

In at least one form, the upper substrate is secured to the lower substrate by depositing a material using a thermal spray process. In at least one variation, a portion of the upper substrate is removed after the material is deposited.

Further areas of applicability will become apparent from the description provided herein. It should be understood that the description and specific examples are intended for purposes of illustration only and are not intended to limit the scope of the present disclosure.

DRAWINGS

Figure 2A:
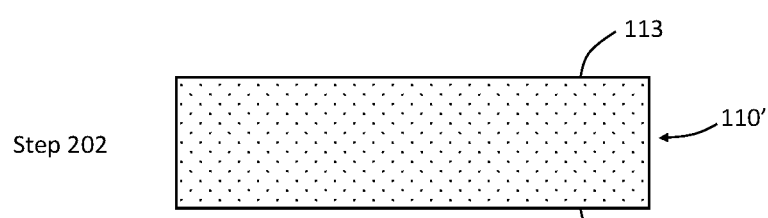
Figure 2B:
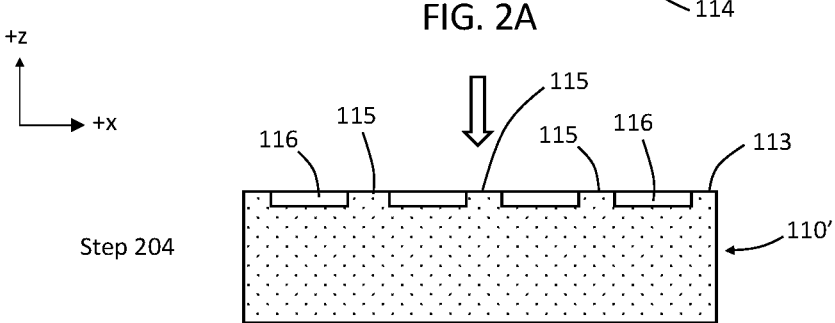
Figure 2C:
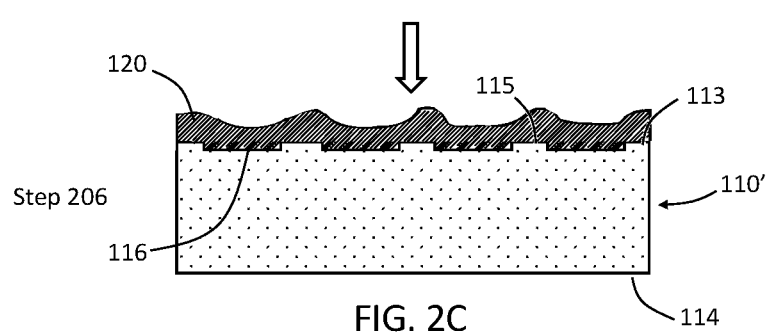
Figure 3:
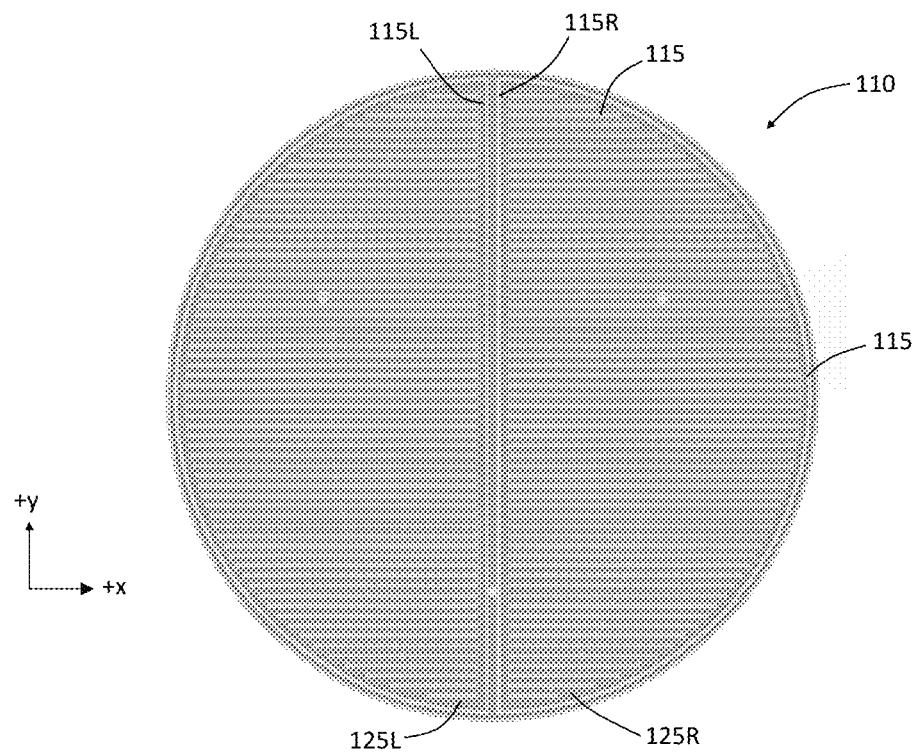
Figure 4:
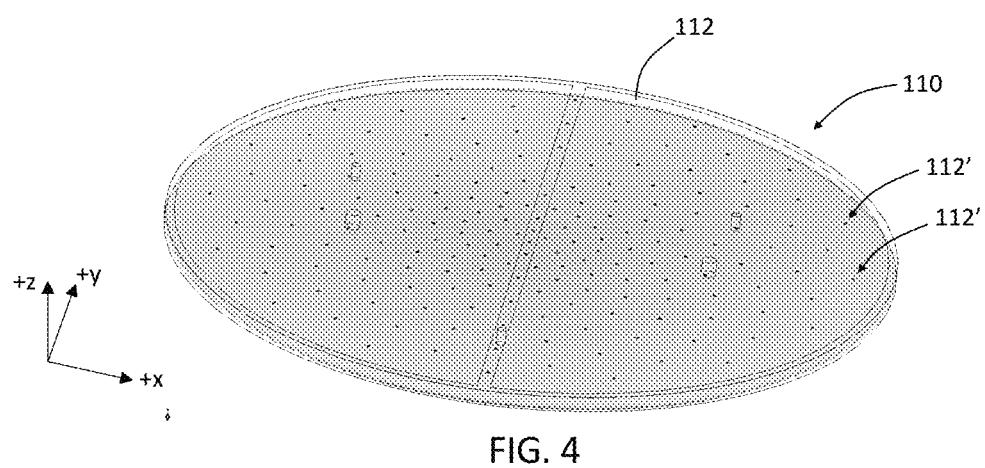

In order that the disclosure may be well understood, there will now be described various forms thereof, given by way of example, reference being made to the accompanying drawings, in which:

FIG. 1 is a cross-sectional view of an E-chuck with an E-puck constructed in accordance with the teachings of the present disclosure;

FIG. 2 depicts a series of steps for a method of manufacturing an E-puck in accordance with the teachings of the present disclosure where: FIG. 2A is cross-sectional view of a lower substrate; FIG. 2B is the lower substrate in FIG. 2A with trenches; FIG. 2C is the lower substrate in FIG. 2B with an electrode material layer deposited on an outer surface of the lower substrate and within the trenches; FIG. 2D is the lower substrate in FIG. 2C with the electrode material layer removed from the outer surface of the lower substrate; FIG. 2E is the lower substrate in FIG. 2D with an upper substrate deposited on at least one electrode element and the outer surface of the lower substrate; FIG. 2F is the lower substrate in FIG. 2E with the upper substrate thinned and smoothed to form an E-puck; FIG. 2G is the lower substrate in FIG. 2D with a dielectric plate bonded on at least one electrode element and an outer surface of the lower substrate; FIG. 2H is the lower substrate in FIG. 2G with the dielectric plate thinned and smoothed to form a ceramic substrate for an E-puck; FIG. 2I is the E-puck in FIG. 2F and the E-puck in FIG. 2H with mesas formed in an outer surface; and FIG. 2J is an enlarged view of section 2J in FIG. 2I;

FIG. 3 is a top view of a ceramic substrate with trenches filled with electrode material and standoff features between the trenches in accordance with the teachings of the present disclosure; and FIG. 4 is an isometric view of a ceramic substrate with mesas extending from an outer surface thereof in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. Examples are provided to fully convey the scope of the disclosure to those who are skilled in the art. Numerous specific details are set forth such as types of specific components, devices, and methods, to provide a thorough understanding of variations of the present disclosure. It will be apparent to those skilled in the art that specific details need not be employed and that the examples provided herein, may include alternative embodiments and are not intended to limit the scope of the disclosure. In some examples, well-known processes, well-known device structures, and well-known technologies are not described in detail.

Referring to FIG. 1, an E-chuck 10 with an E-puck 100 constructed in accordance with the teachings of the present disclosure is shown. In one form, the E-chuck 10 comprises the E-puck 100, a heater 130 and a cooling plate 150. The heater 130 is bonded to the E-puck 100 via a bonding layer 132 and the cooling plate 150 is bonded to the heater 130 via a bonding layer 154. The heater 130 includes a heating layer 134 for generating heat that is transferred to a semiconductor wafer 'W' electrostatically held to the E-chuck 10 by the E-puck 100. Also, the cooling plate 150 can include one or more cooling channels (not shown) to withdraw heat from the heater 130. As shown, the E-chuck 10 is used as a part of a support pedestal in semiconductor processing. However, it should be understood that the E-puck 100 may be employed in other applications while remaining within the scope of the present disclosure.

The E-puck 100 includes a ceramic substrate 110 that defines a first surface 112 (also referred to herein as an "upper surface") for the wafer W to be positioned thereon and a lower surface 114 for bonding to the heater 130. An electrode layer 124 with at least one electrode element 125 (also referred to herein simply as an "electrode") is embedded within the ceramic substrate 110. To form a support pedestal, a tubular shaft (not shown) is bonded to a lower surface 152 of the cooling plate 150 and surround wires connected to the heating layer 134 and the at least one electrode 125. In operation, the wafer W is disposed on the upper surface 112 of the ceramic substrate 110 and held in a desired positioned by an electrostatic force generated between the wafer W and the at least one electrode 125 embedded inside the ceramic substrate 110.

Referring now to FIGS. 2A-2F, a method of manufacturing the E-puck 100 is provided.

As shown in FIG. 2A, the method provides a ceramic plate member 110' (also referred to herein as a "lower substrate") with an upper surface 113 disposed opposite the lower surface 114 at step 202. Non-limiting examples of the lower substrate 110' include an aluminum nitride substrate and an aluminum oxide substrate, among others.

As shown in FIG. 2B, at least one trench 116 is formed in the upper surface 113 of the lower substrate 110' at step 204. That is, the at least one trench 116 extends from the upper surface 113 towards (–z direction) the lower surface 114. Forming each trench 116 produces a pair of adjacent standoff portions or steps 115. It should be understood that the at least one trench 116 can be formed using any known or yet to be developed material removal technique. Non-limiting examples of material removal techniques include grinding, laser cutting, etching, machining, photolithography, laser cutting, etching and sand or grit blasting, among others. It should also be understood that in at least one variation of the present disclosure the standoff portions 115 are within the at least one trench 116. For example, in one variation the at least one trench 116 in FIG. 2B is a single trench 116 and the standoff portions 115 are within the trench 116.

As shown in FIG. 2C, an electrode material 120 is deposited onto upper surface 113 of the lower substrate 110', the standoff portions 115, and into the at least one trench 116 to form an electrode material layer 122 at step 206. Non-limiting examples of the electrode material include titanium, molybdenum, tungsten, nickel, aluminum and alloys thereof, among others. It should be understood that the electrode material layer 122, and other layers disclosed herein, can be deposited using any known or yet to be developed material layer deposition technique(s). Non-limiting examples of material layer deposition techniques include cathodic arc discharge, cold spray, chemical vapor deposition (CVD) techniques, physical vapor deposition (PVD) techniques, sputtering, and vacuum plasma spray, among others. Additional non-limiting examples of material layer deposition techniques including layered processes such as thick film, thin film, thermal spray, and sol-gel. In one variation the electrode material layer 122 is deposited using thermal spray.

As shown in FIG. 2D, at least a portion or thickness (z direction) of the electrode material layer 122 extending over or deposited onto the standoff portions 115 (i.e., excess electrode material 120) is removed at step 208. In some forms, the electrode material layer 122 is substantially removed from the standoff portions 115. However, and as shown in the figure, the electrode material 120 remains in the at least one trench 116 such that at least one electrode 125 is formed. It should be understood that the electrode material layer 122, and other layers disclosed herein, can be removed using any known or yet to be developed layer removal technique. Non-limiting examples of layer removal techniques include lapping, polishing, and chemical mechanical polishing (CMP), among others. Also, the stand-off portions 115 reduce or prevent dishing of the electrode material 120 within the at least one trench 114 during removal of the excess electrode material 120 such that a smooth and flat (x-y plane) electrode 125 is produced. As used herein the term "dishing" refers to overpolishing and removal of electrode material within a trench (e.g., in the −z direction in the figures) such that a planar outer surface of an electrode is not provided. In at least one variation of the present disclosure, the electrode 125 is flat within about 5 µm, for example within about 2 µm, to a planar surface extending parallel to the upper surface 113.

As shown in FIGS. 2E and 2F, in at least one form of the present disclosure a dielectric layer 118 (also referred to herein as an "upper substrate") is formed by depositing a dielectric material 117 on the lower substrate 110' as shown in FIGS. 2E and 2F. Particularly, the dielectric material 117 is deposited onto the at least one electrode 125 and adjacent standoff portions 115 to form a precursor upper substrate 118' at step 210 (FIG. 2E). Then, the precursor upper substrate 118' is thinned and smoothed to form the upper substrate 118 and produce the ceramic substrate 110 with the upper surface 112 at step 212 (FIG. 2F). Accordingly, the upper substrate 118 is secured to the lower substrate 110' without hot pressing the two substrates 110', 118 together and the at least one electrode 125 is embedded within the ceramic substrate 110 as shown in FIG. 2F. In at least one variation, securing the upper substrate 118 to the lower substrate 110' includes depositing the dielectric material 117 using a layered process such as thick film, thin film, thermal spray, and sol-gel, among others. Non-limiting examples of the thickness of the at least one electrode 125 range from 5 micrometers (µm) to 125 µm, for example between 10 µm to 50 µm. Non-limiting examples of the upper substrate 118 range from 25 µm to 500 µm, for example between 100 µm to 300 µm.

As shown in FIGS. 2G and 2H, in at least one other form of the present disclosure the upper substrate 118 (FIG. 2H) is formed by bonding a dielectric plate 111 on the lower substrate 110'. Particularly, the dielectric plate 111 is bonded onto the at least one electrode 125 and/or adjacent standoff portions 115 to form a precursor upper substrate 111' at step 214 (FIG. 2G). Then, the precursor upper substrate 111' is thinned and smoothed to form the upper substrate 118 and produce the ceramic substrate 110 with the upper surface 112 at step 216 (FIG. 2H). In at least one variation the upper substrate 118 is bonded to the lower substrate 110' such that a bond area 111b is formed by the bonding. In one variation the bond area 111b is recessed (+z direction) from a lower surface 118' of the upper substrate 118. In such variations the upper surface 113 of the lower substrate 110' and the lower surface 118' of the upper substrate 118 are bonded within a distance of each other less than or equal to about 5 µm. Accordingly, the upper substrate 118 is secured to the lower substrate 110' without hot pressing the two substrates 110', 118 together and the at least one electrode 125 is embedded within the ceramic substrate 110 as shown in FIG. 2H. The dielectric plate 111 can be bonded to the at least one electrode 125 and/or adjacent standoff portions 115 using known or yet to be developed bonding techniques. Non-limiting examples of bonding techniques include the use of adhesives, brazing, and transient liquid phase bonding, among others.

In either form of the present disclosure, the ceramic substrate 110 with at least one embedded electrode 125 shown in FIGS. 2F and/or 2H can be further processed as shown in FIG. 2I such that mesas 112' are formed on or in the upper surface 112 of the ceramic substrate 110 (i.e., the outer surface (+z direction) of the upper substrate 118). As used herein, the term "mesas" refers to ledges or steps that provide a gap or space between a semiconductor wafer W and the E-puck 100. The mesas can be formed on or in the upper surface 112 using the same material removal techniques noted above. It should be understood that the mesas 112' provide a plurality of gaps or spaces 119 between the wafer W and the ceramic substrate 110 such that removal of the wafer W from the E-puck 100 is facilitated and/or made easier than if the gaps 119 were not present on the upper surface 112 of the E-puck 110.

Referring now to FIG. 2J, in some aspects of the present disclosure the upper surface 112 including the mesas 112' are coated with an oxide layer 160 such that chemical erosion of the upper surface 112 and/or the mesas 112' during semiconductor processing of the wafer W is reduced. The oxide layer 160 can be deposited on the upper surface 112 (and the mesas 112') of the upper substrate 118 using the same material layer deposition techniques noted above and non-limiting ranges of a thickness of the oxide layer is between about 500 nm to about 10 µm, for example between about 1 µm and about 10 µm, between about 2 µm and about 8 µm and between about 3 µm and 7 µm. Non-limiting examples of oxides that form the oxide layer 160 include yttria, alumina, sapphire, silica, and SiC, among others.

Referring now to FIG. 3, a top view of the ceramic substrate 110 comprising a plurality of electrodes 125 disposed in a plurality of trenches (not labeled) between a plurality of standoff features 115 is shown. As shown in FIG. 3, an electrode 125R on the right hand side (+x direction) of the ceramic substrate 110 is isolated from an electrode 125L on the left hand side (−x direction) of the ceramic substrate 110 by standoff features 115R and 115L, thereby providing a bipolar electrode design with one of the electrodes 125 being a cathode and the other electrode 125 being an anode.

Referring now to FIG. 4, an isometric view of the ceramic substrate 110 with a plurality of mesas 112' on the upper surface 112. The plurality of mesas 112' extending upwardly (+z direction) from the upper surface 112 and support a wafer electrostatically attached to the upper substrate 118.

It should be understood from the teachings of the present disclosure that an E-puck and a method of constructing an E-puck is provided. The method forms trenches with adjacent standoff features in a lower substrate and deposits an electrode material into the trenches. Excess electrode material deposited onto the standoff features is removed therefrom and the standoff features reduce and/or prevent dishing of the electrode material within the trenches such that a flat outer surface of an electrode is produced. An upper substrate is formed over the electrode and lower substrate without hot pressing such that the electrode is embedded within an E-puck ceramic substrate. Accordingly, an electrode with a uniform thickness and a "flatness" of less than or equal to about 2 µm embedded within an E-puck ceramic substrate is provided. It should be understood that the uniform thickness and flatness of the electrode provides an improved (e.g., more uniform) electrostatic force between a wafer and the electrode embedded inside the E-puck during semiconductor processing of the wafer.

When an element or layer is referred to as being "on," "engaged to," or "coupled to," another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above or below. The device may be otherwise oriented (rotated 90 degrees or at other orientations) and the spatially relative descriptors used herein interpreted accordingly.

As used herein, the phrase at least one of A, B, and C should be construed to mean a logical (A OR B OR C), using a non-exclusive logical OR, and should not be construed to mean "at least one of A, at least one of B, and at least one of C.

Unless otherwise expressly indicated, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The terminology used herein is for the purpose of describing particular example forms only and is not intended to be limiting. The singular forms "a," "an," and "the" may be intended to include the plural forms as well, unless the context clearly indicates otherwise. The terms "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, examples that do not depart from the substance of the disclosure are intended to be within the scope of the disclosure. Such examples are not to be regarded as a departure from the spirit and scope of the disclosure. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A method of constructing a puck for an electrostatic chuck, the electrostatic chuck being configured to operate at between 300 to 12,000 volts during semiconductor etching or processing, the method comprising the steps of:
    forming at least one trench into an upper surface of a lower substrate;
    depositing an electrode material onto the upper surface of the lower substrate and into the at least one trench, such that excess electrode material is disposed over the upper surface of the lower substrate and the at least one trench;
    removing the excess electrode material from the lower substrate, including the excess electrode material from over the upper surface of the lower substrate and the at least one trench, to thereby leave the electrode material within the at least one trench of the lower substrate to form an electrode, wherein the electrode is flat and co-planar with the upper surface of the lower substrate; and
    securing an upper substrate to the lower substrate without hot pressing, wherein securing the upper substrate to the lower substrate comprises bonding by a technique selected from the group consisting of brazing, adhesives, and transient liquid phase bonding,
    wherein the lower substrate and the upper substrate comprise a ceramic material.

2. The method according to claim 1, wherein the excess electrode material is removed by a process selected from a group consisting of a chemical-mechanical planarization/polishing (CMP), etching, and polishing.

3. The method according to claim 1 further comprising at least one standoff portion within the at least one trench.

4. The method according to claim 1, wherein securing the upper substrate to the lower substrate comprises bonding the upper substrate to the lower substrate such that a bond area is formed by the bonding, the bond area being recessed from the lower surface of the upper substrate.

5. The method according to claim 1, wherein the electrode is flat and co-planar with a wafer attached to the upper substrate after removing excess electrode material.

6. The method according to claim 1 further comprising forming mesas on an outer surface of the upper substrate.

7. The method according to claim 6 further comprising depositing an oxide layer onto the outer surface of the upper substrate layer.

8. The method according to claim 7, wherein the oxide layer comprises at least one of yttria, alumina, sapphire, silica, and silicon carbide.

9. The method according to claim 1, wherein the at least one trench is formed by a process selected from the group consisting of a laser removal process, a bead blasting process, machining, 3D sintering/printing/additive manufacturing, green state, molding, waterjet, hybrid laser/water, and dry plasma etching.

10. The method according to claim 1, wherein the electrode material is deposited onto the lower substrate and into the at least one trench by a layered process.

11. The method according to claim 10, wherein the layered process is selected from the group consisting of thick film, thin film, thermal spray, and sol-gel.

12. The method according to claim 1, wherein the electrode material is deposited by melting a metal foil into the at least one trench.

13. The method according to claim 1, wherein the lower substrate is a ceramic selected from the group consisting of aluminum nitride, and aluminum oxide and the electrode material is selected from the group consisting of titanium, molybdenum, tungsten, nickel, aluminum and alloys thereof.

14. The method according to claim 1, wherein the step of removing the excess electrode material comprises at least one of lapping, polishing, and chemical mechanical polishing.

15. A method of constructing a puck for an electrostatic chuck, the electrostatic chuck being configured to operate at between 300 to 12,000 volts during semiconductor etching or processing, the method comprising the steps of:
    forming at least one trench into a lower substrate, wherein a plurality of standoff portions are formed within the at least one trench;
    depositing an electrode material onto the lower substrate and into the at least one trench, such that excess electrode material is disposed over the upper surface of the lower substrate and the at least one trench;
    removing the excess electrode material from the lower substrate, including the excess electrode material from over the upper surface of the lower substrate and the at least one trench, to thereby leave the electrode material within the at least one trench to form an electrode, wherein the electrode is flat and co-planar with the upper surface of the lower substrate; and
    securing an upper substrate to the lower substrate without hot pressing, wherein securing the upper substrate to the lower substrate comprises depositing a material using a layered process selected from the group consisting of thick film, thin film, thermal spray, and sol-gel,
    wherein the lower substrate and the upper substrate comprise a ceramic material.

16. The method according to claim 15, wherein securing the upper substrate to the lower substrate comprises bonding the upper substrate to the lower substrate such that a bond area is formed by the bonding, the bond area being recessed from the lower surface of the upper substrate.

17. The method according to claim 15, wherein securing the upper substrate to the lower substrate comprises depositing a material using a thermal spray process.

18. The method according to claim 17 further comprising removing a portion of the upper substrate after depositing the material.

19. The method according to claim 17, wherein the electrode material is deposited onto the substrate and into the at least one trench by a layered process.

20. A method of constructing a puck for an electrostatic chuck, the electrostatic chuck being configured to operate at between 300 to 12,000 volts during semiconductor etching or processing, the method comprising the steps of:
    forming at least one trench into an upper surface of a lower substrate;
    depositing an electrode material onto the upper surface of the lower substrate and into the at least one trench, such that excess electrode material is disposed over the upper surface of the lower substrate and the at least one trench;
    removing the excess electrode material from the lower substrate, including the excess electrode material from over the upper surface of the lower substrate and the at least one trench, to thereby leave the electrode material within the at least one trench of the lower substrate to form an electrode, wherein the electrode is flat and co-planar with the upper surface of the lower substrate;
    securing an upper substrate to the lower substrate without hot pressing; and
    thinning and smoothing an upper surface of the upper substrate, such that the at least one electrode remains in contact with the upper substrate following thinning and smoothing of the upper surface of the upper substrate,
    wherein the lower substrate and the upper substrate comprise a ceramic material.

* * * * *